United States Patent
Yang et al.

(10) Patent No.: US 10,579,393 B2
(45) Date of Patent: Mar. 3, 2020

(54) CIRCUIT AND METHOD OF POWER ON INITIALIZATION FOR CONFIGURATION MEMORY OF FPGA

(71) Applicant: Capital Microelectronics co., Ltd., Beijing (CN)

(72) Inventors: Xian Yang, Beijing (CN); Qinghua Xue, Beijing (CN)

(73) Assignee: Capital Microelectronics Co., Ltd., Beijing (CN)

( * ) Notice: Subject to any disclaimer, the term of this patent is extended or adjusted under 35 U.S.C. 154(b) by 39 days.

(21) Appl. No.: 15/026,824

(22) PCT Filed: Jul. 21, 2015

(86) PCT No.: PCT/CN2015/084675
§ 371 (c)(1),
(2) Date: Apr. 1, 2016

(87) PCT Pub. No.: WO2017/012072
PCT Pub. Date: Jan. 26, 2017

(65) Prior Publication Data
US 2017/0168842 A1 Jun. 15, 2017

(51) Int. Cl.
*G06F 17/50* (2006.01)
*G06F 1/24* (2006.01)
(Continued)

(52) U.S. Cl.
CPC .............. *G06F 9/4405* (2013.01); *G06F 1/24* (2013.01); *G06F 12/0646* (2013.01);
(Continued)

(58) Field of Classification Search
CPC .............. G06F 17/5054; G06F 17/5027; G06F 12/0646; G06F 1/24; G11C 16/20; G11C 16/08; G11C 8/08; G11C 8/10; G11C 8/11
See application file for complete search history.

(56) References Cited

U.S. PATENT DOCUMENTS 5,615,159 A * 3/1997 Roohparvar ........... G11C 16/20
365/185.07
6,023,421 A 2/2000 Clinton et al.
(Continued)

FOREIGN PATENT DOCUMENTS

CN 1159060 A 9/1997
CN 1 03500584 A 1/2014

OTHER PUBLICATIONS

International Search Report (PCT/ISA/210) dated Oct. 15, 2015, by the Japanese Patent Office as the International Searching Authority for International Application No. PCT/CN2015/084675.
(Continued)

*Primary Examiner* — Huan Hoang
*Assistant Examiner* — Jay W. Radke
(74) *Attorney, Agent, or Firm* — Buchanan Ingersoll & Rooney PC

(57) ABSTRACT

A circuit and method of power on initialization for a configuration memory of an FPGA. The circuit includes: a decoding circuit, a driving circuit, and a configuration memory, where when 0 is written for the $1^{st}$ time, the decoding circuit turns on a word line corresponding to an address in the configuration memory, and the driving circuit writes content of the word line into 0; and when 0 is written for the $i^{th}$ time, the decoding circuit turns on at least one word line corresponding to at least one address in the configuration memory, and the driving circuit writes content of each word line in the at least one word line into 0, the number of the at least one address being less than or equal to a sum of addresses that have completed writing of 0 for the previous $(i-1)^{th}$ time.

8 Claims, 6 Drawing Sheets

(51) Int. Cl.
   *G06F 9/4401* (2018.01)
   *G11C 16/20* (2006.01)
   *G06F 15/78* (2006.01)
   *G11C 8/08* (2006.01)
   *G11C 8/10* (2006.01)
   *G11C 16/08* (2006.01)
   *G06F 12/06* (2006.01)

(52) U.S. Cl.
   CPC ...... *G06F 15/7867* (2013.01); *G06F 15/7871* (2013.01); *G11C 8/08* (2013.01); *G11C 8/10* (2013.01); *G11C 16/08* (2013.01); *G11C 16/20* (2013.01); *G06F 2212/206* (2013.01)

(56) References Cited

U.S. PATENT DOCUMENTS

| | | | | |
|---|---|---|---|---|
| 6,243,294 | B1* | 6/2001 | Rao | G11C 16/08 365/185.14 |
| 6,771,546 | B2* | 8/2004 | Ikehashi | G11C 7/02 365/189.04 |
| 6,976,160 | B1* | 12/2005 | Yin | G06F 1/24 326/38 |
| 7,688,629 | B2* | 3/2010 | Kim | G11C 7/067 365/185.11 |
| 7,912,693 | B1 | 3/2011 | Han et al. | |
| 7,937,647 | B2* | 5/2011 | Bellipaddy | G06F 11/1052 714/773 |
| 9,059,705 | B1* | 6/2015 | Edelhaeuser | H03K 19/177 |
| 9,384,813 | B2* | 7/2016 | Aoki | G11C 11/34 |
| 9,659,657 | B2* | 5/2017 | Castro | G11C 8/08 |
| 2014/0075225 | A1* | 3/2014 | Bartling | G06F 11/1469 713/323 |
| 2017/0287536 | A1* | 10/2017 | Bartling | G06F 9/4406 |

OTHER PUBLICATIONS

Written Opinion (PCT/ISA/237) dated Oct. 15, 2015, by the Japanese Patent Office as the International Searching Authority for International Application No. PCT/CN2015/084675.

* cited by examiner

| 1057 | 1 | | 1057 | 1 | | 1057 | 1 | | 1057 | 1 |
|---|---|---|---|---|---|---|---|---|---|---|
| ⋮ | | | ⋮ | | | ⋮ | | | ⋮ | |
| 273 | 1 | | 273 | 1 | | 273 | 1 | | 273 | 0 |
| 272 | 1 | | 272 | 1 | | 272 | 1 | | 272 | 0 |
| 271 | 1 | | 271 | 1 | | 271 | 1 | | 271 | 1 |
| 270 | 1 | | 270 | 1 | | 270 | 1 | | 270 | 1 |
| ⋮ | | | ⋮ | | | ⋮ | | | ⋮ | |
| 257 | 1 | | 257 | 1 | | 257 | 0 | | 257 | 0 |
| 256 | 1 | | 256 | 0 | | 256 | 0 | | 256 | 0 |
| 255 | 1 | | 255 | 1 | | 255 | 1 | | 255 | 1 |
| ⋮ | | | ⋮ | | | ⋮ | | | ⋮ | |
| 18 | 1 | | 18 | 1 | | 18 | 1 | | 18 | 1 |
| 17 | 1 | | 17 | 1 | | 17 | 1 | | 17 | 0 |
| 16 | 1 | | 16 | 1 | | 16 | 1 | | 16 | 0 |
| 15 | 1 | | 15 | 1 | | 15 | 1 | | 15 | 1 |
| ⋮ | | | ⋮ | | | ⋮ | | | ⋮ | |
| 2 | 1 | | 2 | 1 | | 2 | 1 | | 2 | 1 |
| 1 | 1 | | 1 | 1 | | 1 | 0 | | 1 | 0 |
| 0 | 0 | | 0 | 0 | | 0 | 0 | | 0 | 0 |
| Driver 0 | | | Driver 0 | | | Driver 0 | | | Driver 0 | |

| When 0 is written for the 1st time, turn on a word line corresponding to an address in the configuration memory, and write content of the word line into 0 | 510 |

↓

| When 0 is written for the $i^{th}$ time, turn on at least one word line corresponding to at least one address in the configuration memory, and write content of each word line in the at least one word line into 0, the number of the at least one address being less than or equal to a sum of addresses that have completed writing of 0 for the previous $(i-1)^{th}$ time, where i is a positive integer greater than or equal to 2 | 520 |

FIG. 6

CIRCUIT AND METHOD OF POWER ON INITIALIZATION FOR CONFIGURATION MEMORY OF FPGA

BACKGROUND

Technical Field

The present invention relates to the field of integrated circuit design technologies in the microelectronic field, and in particular, to a circuit and method of power on initialization for a configuration memory in a Field-Programmable Gate Array (FPGA).

Related Art

After being powered on, a Field-Programmable Gate Array (FPGA) needs to initialize all configuration memories, that is, all configuration memories need to be reset. In a general method, content of all addresses is set to 0. Generally, the content of the address is set to 0 according to an address sequence, and in a clock cycle, content of merely one address is set to 0; therefore, the number of clock cycles required in the power on initialization process of the configuration memory is the same as the number of addresses. If the address is very long, the cycle of power on initialization of the configuration memory is long accordingly.

To shorten the cycle of the power on initialization of the configuration memory, content of a plurality of addresses may be set to 0 at the same time in one clock cycle. However, when the content of a plurality of addresses is set to 0 at the same time in one clock cycle, a problem of insufficient circuit drive will occur. In this case, if the drive is purely increased, for a large address, the size of a drive MOS transistor required is also very large. In addition, insufficient drive may also cause bit line turnover, resulting in a more difficult 0-writing operation.

SUMMARY

An objective of the present invention is to enable an easier 0 writing operation in a power on initialization process of a configuration memory without increasing drive, and to greatly shorten the cycle of initialization.

To achieve the above objective, the present invention provides a circuit and method of power on initialization for a configuration memory of an FPGA.

In a first aspect, an embodiment of the present invention provides a circuit of power on initialization for a configuration memory of an FPGA, and the circuit includes: a decoding circuit, a driving circuit, and a configuration memory, where the decoding circuit is configured to turn on a word line corresponding to an address in the configuration memory, and the driving circuit writes a logic 0 to each memory cell of a row of memory cells corresponding to the word line that is turned on; and when writing 0 for an ith time, the decoding circuit is configured to turn on at least one other word line corresponding to at least one other address in the configuration memory, and the driving circuit writes a logic 0 to each memory cell in a row of memory cells corresponding to the other word line that is turned on, the number of the at least one other addresses being less than or equal to a sum of addresses that have completed writing of 0 for the previous (i−1) times, where i is a positive integer greater than or equal to 2.

Preferably, the decoding circuit includes a plurality of decoders and a delay circuit, where the delay circuit is configured to delay a first control signal corresponding to an address signal of a part of decoders in the plurality of decoders, and output a delayed first control signal; and the plurality of decoders is configured to turn on a word line corresponding to an address writing 0 for the $j^{th}$ time in the configuration memory according to the delayed first control signal and a non-delayed second control signal, where j is 1 or i.

Further preferably, the plurality of decoders includes a first decoder, a second decoder and a third decoder, and the delay circuit includes two first delay circuits and two second delay circuits, where the two first delay circuits are respectively configured to delay first control signals corresponding to address signals before inputting into the first decoder and after inputting into the first decoder, and output delayed first control signals;

the two second delay circuits are respectively configured to delay first control signals corresponding to address signals before inputting into the second decoder and after inputting into the second decoder, and output delayed first control signals; and when the delayed first control signals output by the first decoder and the second decoder and a non-delayed second control signal output by the third decoder are in a first rising/falling edge and/or a first level, the plurality of decoders turns on a word line corresponding to the address writing 0 for the $j^{th}$ time in the configuration memory.

Further preferably, the delay circuit is an inverter chain circuit.

Preferably, a time interval of the decoding circuit turning on word lines corresponding to addresses writing 0 for the adjacent times is a time of executing and completing the previous 0 writing operation.

In a second aspect, an embodiment of the present invention provides a method of power on initialization for a configuration memory of an FPGA, and the method includes:

turning on a word line corresponding to an address in the configuration memory, and writing a logic 0 to each memory cell of a row of memory cells corresponding to the word line that is turned on; and for i additional times, turning on at least one other word line corresponding to at least one other address in the configuration memory, and writing writes a logic 0 to each memory cell in a row of memory cells corresponding to the other word line that is turned on, the number of the at least one other addresses being less than or equal to a sum of addresses that have completed writing of 0 for the previous (i−1) times, where i is a positive integer greater than or equal to 2.

Preferably, the method further includes:

delaying a first control signal corresponding to a first address signal, and outputting a delayed first control signal; and turning on a word line corresponding to an address writing 0 for the $j^{th}$ time in the configuration memory according to the delayed first control signal and a non-delayed second control signal, where j is 1 or i.

Further preferably, the turning on a word line corresponding to an address writing 0 for the $j^{th}$ time in the configuration memory according to the delayed first control signal and a non-delayed second control signal includes:

when the delayed first control signal and the non-delayed second control signal are in a first rising/falling edge and/or a first level, turning on a word line corresponding to the address writing 0 for the $j^{th}$ time in the configuration memory.

Further preferably, the first control signal corresponding to the first address signal is delayed with an inverter chain circuit, and the delayed first control signal is output.

Preferably, a time interval of turning on word lines corresponding to addresses writing 0 for the adjacent times is a time of executing and completing the previous 0 writing operation.

Based on the above technical solution, in the circuit and method of power on initialization for a configuration memory in an FPGA, the number of addresses, into which 0 is going to be set, turned on by the decoding circuit is not greater than the number of addresses having 0 set therein, and the driving circuit writes content of the addresses, into which 0 is going to be set, turned on by the decoding circuit to 0, so that the 0 writing operation in the power on initialization process of the configuration memory is easier, and the cycle of initialization can be greatly shortened, especially when the address is very long.

BRIEF DESCRIPTION OF THE DRAWINGS

To describe the technical solutions of the embodiments of the present invention more clearly, the following briefly introduces the accompanying drawings required for describing the embodiments. Apparently, the accompanying drawings in the following description show only some embodiments of the present disclosure, and a person of ordinary skill in the art may still derive other drawings from these accompanying drawings without creative efforts.

FIG. 4 is a schematic block diagram of a configuration memory included in the circuit shown in FIG. 3;

FIG. 6 is a schematic flow chart of a method of power on initialization for a configuration memory in an FPGA according to an embodiment of the present invention.

DETAILED DESCRIPTION

The following clearly and completely describes the technical solutions in the embodiments of the present invention with reference to the accompanying drawings in the embodiments of the present invention. Apparently, the described embodiments are some of the embodiments of the present invention rather than all of the embodiments. All other embodiments obtained by a person of ordinary skill in the art based on the embodiments of the present invention without creative efforts shall fall within the protection scope of the present invention.

Figure 1:
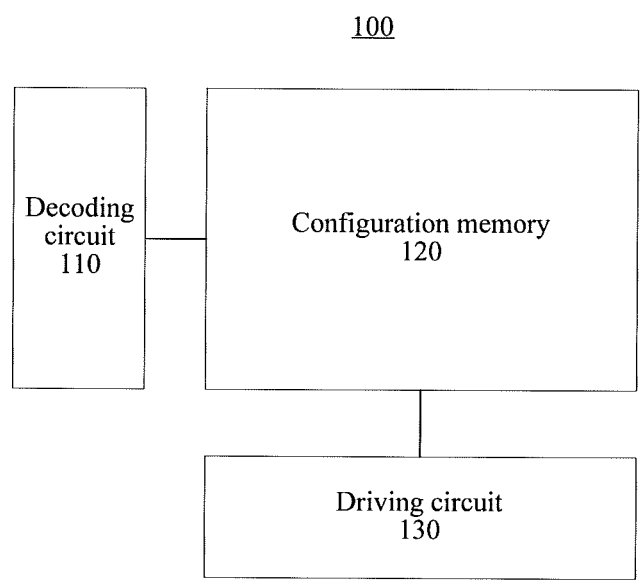
FIG. 1 is a schematic block diagram of a circuit of power on initialization for a configuration memory in an FPGA according to an embodiment of the present invention.

FIG. 1 is a schematic block diagram of a circuit 100 of power on initialization for a configuration memory in an FPGA according to an embodiment of the present invention.

The circuit 100 shown in FIG. 1 includes: a decoding circuit 110, a configuration memory 120, and a driving circuit 130, where the decoding circuit 110 is configured to turn on a word line corresponding to an address in the configuration memory 120, and the driving circuit 130 writes a logic 0 to each memory cell of a row of memory cells corresponding to the word line that is turned on; and for i additional times, the decoding circuit 110 is configured to turn on at least one other word line corresponding to at least one other address in the configuration memory 120, and the driving circuit 130 writes a logic 0 to each memory cell in a row of memory cells corresponding to the other word line that is turned on, the number of the at least one other addresses being less than or equal to a sum of addresses that have completed writing of 0 for the previous where i is a positive integer greater than or equal to 2.

Specifically, in the embodiment of the present invention, the process of power on initialization for the configuration memory of the FPGA is a process of writing 0 into all addresses in the configuration memory, when 0 is set for the $1^{st}$ time, the decoding circuit 110 may turn on a word line corresponding to an address in the configuration memory 120, and the driving circuit 130 writes a logic 0 to each memory cell of a row of memory cells corresponding to the word line that is turned on; when 0 is set for the $2^{nd}$ time, the decoding circuit 110 may turn on a word line corresponding to another address in the configuration memory 120, and the driving circuit 130 writes a logic 0 to each memory cell of a row of memory cells corresponding to the word line that is turned on; when 0 is set for the $3^{rd}$ time, the decoding circuit 110 may turn on two word lines corresponding to other two addresses in the configuration memory 120, and the driving circuit 130 writes a logic 0 to each memory cell of a row of memory cells corresponding to the word lines that are turned on; and when 0 is set for a $i^{th}$ time, the number of addresses that can be turned on by the decoding circuit 110 is less than or equal to the sum of the number of addresses having completed writing of 0 previously, and by such analogy, all addresses in the configuration memory may be set to 0 within a very short cycle, thereby completing the power on initialization of the configuration memory.

In the circuit of power on initialization for a configuration memory in an FPGA provided according to the embodiment of the present invention, when 0 is set for the $i^{th}$ time, the number of turned on addresses is less than or equal to the sum of addresses having completed writing of 0 for the previous (i−1) times, i may be a positive integer greater than or equal to 2, and in this way, the problem of a difficult 0 writing operation caused by insufficient driving may be avoided.

Therefore, in the circuit of power on initialization for a configuration memory in an FPGA provided in the embodiment of the present invention, the number of addresses, into which 0 is going to be set, turned on by the decoding circuit is not greater than the number of addresses having 0 set therein, and the driving circuit writes content of the addresses, into which 0 is going to be set, turned on by the decoding circuit to 0, so that the 0 writing operation in the power on initialization process of the configuration memory is easier, and the cycle of initialization can be greatly shortened, especially when the address is very long.

It should be understood that, in the embodiment of the present invention, a time interval of the decoding circuit 110 turning on word lines corresponding to addresses writing 0 for the adjacent times is a time of executing and completing the previous 0 writing operation. In other words, a time interval between turning on a word line corresponding to an address writing 0 for the next time and turning on a word line corresponding to an address writing 0 for the previous time is a time of executing and completing the previous 0 writing operation. For example, a time interval between turning on a word line corresponding to an address writing 0 for the $3^{rd}$ time and turning on a word line corresponding to an address writing 0 for the $2^{nd}$ time is a time of executing and completing the 0 writing operation for the $2^{nd}$ time.

Figure 2:
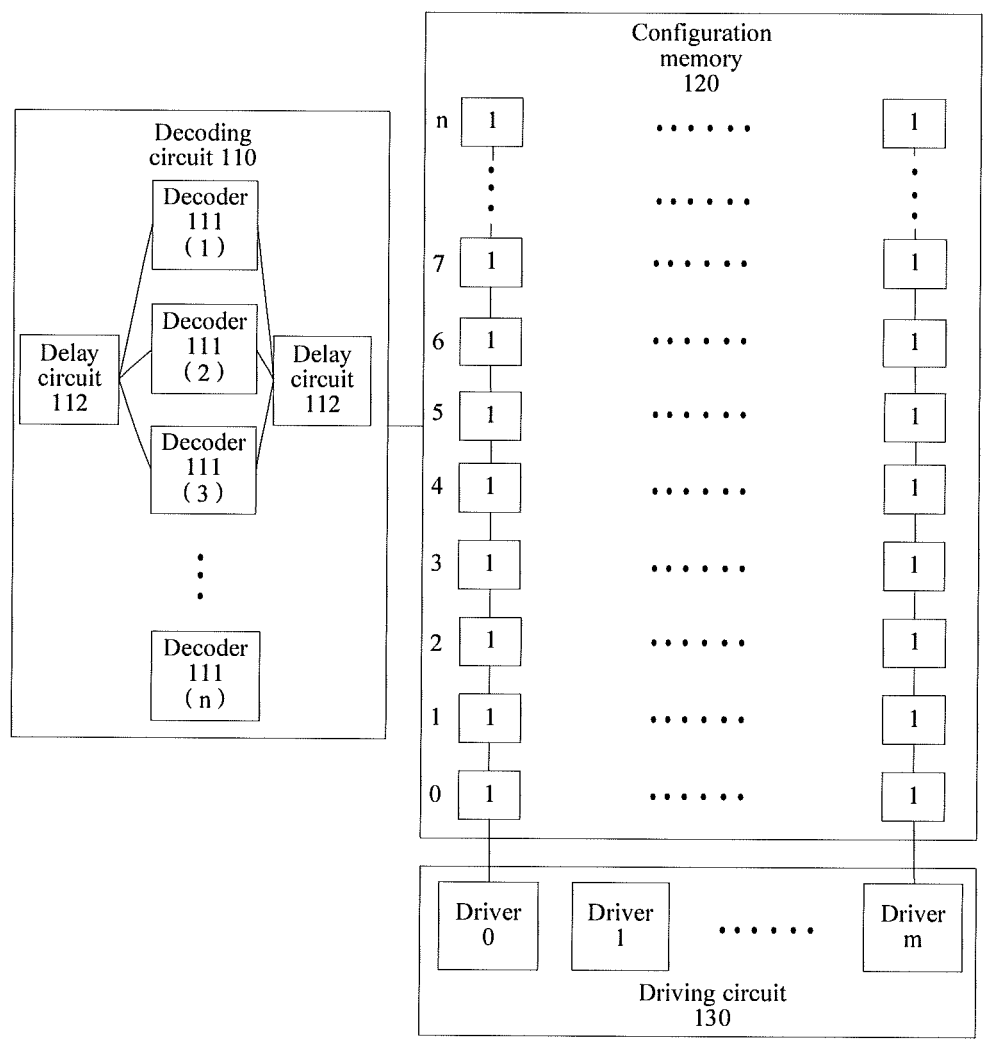
FIG. 2 is a schematic block diagram of a circuit of power on initialization for a configuration memory in an FPGA according to another embodiment of the present invention.

Optionally, as an embodiment of the present invention, as shown in FIG. 2, the decoding circuit 110 includes a plurality of decoders 111 and a delay circuit 112, where the delay circuit 112 is configured to delay a first control signal corresponding to an address signal of a part of decoders in the plurality of decoders 111, and output a delayed first control signal; and the plurality of decoders 111 is configured to turn on a word line corresponding to an address writing 0 for the $j^{th}$ time in the configuration memory 120 according to the delayed first control signal and a non-delayed second control signal, where j is 1 or i.

Specifically, in the embodiment of the present invention, to ensure that during writing 0 for the $1^{st}$ time and the ith time, the number of addresses turned on by the decoding circuit 110 is less than or equal to the sum of addresses having completed 0 writing for the previous (i−1) times, it is required to delay, by using the delay circuit 112, the first control signal corresponding to the address signal of a part of decoders in the plurality of decoders 111 included in the decoding circuit 110, and output the delayed first control signal, so that rising edges or falling edges of the delayed first control signal and the non-delayed second control signal do not occur at the same time, but are staggered by a small time length. The plurality of decoders 111 turns on a word line corresponding to an address writing 0 for the $j^{th}$ time in the configuration memory 120 according to the delayed first control signal and the non-delayed second control signal, where j is 1 or i.

It should be understood that in the embodiment of the present invention, the delay circuit 112 may be an inverter chain circuit similar to an RC filter circuit. In order that rising edges or falling edges of the delayed first control signal and the non-delayed second control signal do not occur at the same time, but are staggered by a small time length, the delay circuit 112 may be a plurality of delay circuits, respectively configured to delay first control signals corresponding to address signals before inputting to each decoder in a part of decoders and after inputting to each decoder.

Optionally, the plurality of decoders 111 includes a first decoder 111(1), a second decoder 111(2) and a third decoder 111(3), and the delay circuit includes two first delay circuits 112(1)(a) and 112(1)(b), and two second delay circuits 112(2)(a) and 112(2)(b).

The two first delay circuits 112(1)a and 112(1)b are respectively configured to delay first control signals corresponding to address signals before inputting into the first decoder 111(1) and after inputting into the first decoder 111(1), and output delayed first control signals;

the two second delay circuits 112(2)(a) and 112(2)(b) are respectively configured to delay first control signals corresponding to address signals before inputting into the second decoder 111(2) and after inputting into the second decoder 111(2), and output delayed first control signals; and when the delayed first control signals output by the first decoder 111(1) and the second decoder 111(2) and a non-delayed second control signal output by the third decoder 111(3) are in a first rising/falling edge and/or a first level, the plurality of decoders 111 turns on a word line corresponding to the address writing 0 for the $j^{th}$ time in the configuration memory 120. The first rising/falling edge includes a rising edge or a falling edge, and the first level includes a high level or a low level.

Specifically, the technical solution of the embodiment of the present invention may be described in detail with reference to FIG. 3 and FIG. 4. The circuit 100 shown in FIG. 3 includes: a decoding circuit 110, a configuration memory 120 and a driver 0, where the decoding circuit 110 includes two 4/16 decoders 111(1), 111(2) and a 3/5 decoder 111(3), and two 1-delay circuits 112(1)(a) and 112(1)(b) and two 2-delay circuits 112(2)(a) and 112(2)(b); and the configuration memory 120 has 1058 addresses with address numbers from 0 to 1057.

It should be noted that, in the embodiment of the present invention, the configuration memory 120 has 1058 addresses with address numbers from 0 to 1057, so two 4/16 decoders and a 3/5 decoder are selected to implement the process of power on initialization for the configuration memory. In other words, the number and types of the decoders may be determined according to the number of addresses that need to be reset during power on initialization for the configuration memory, for example, there are 1024 addresses that need to be reset during power on initialization for the configuration memory, and two 3/8 decoders and a 4/16 decoder may be selected.

Figure 3:
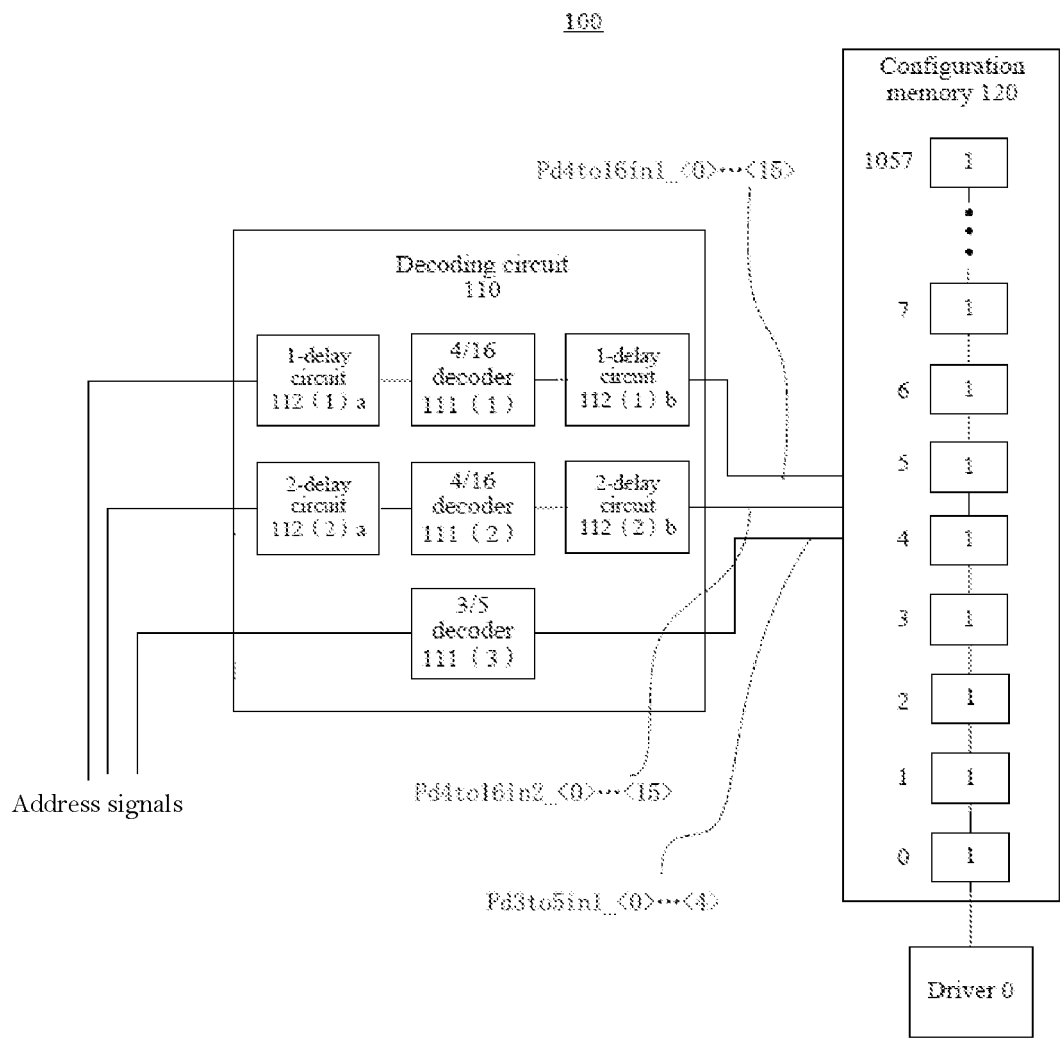
FIG. 3 is a schematic block diagram of a circuit of power on initialization for a configuration memory in an FPGA according to still another embodiment of the present invention.

It should be further noted that, in FIG. 3, the two 1-delay circuits 112(1)(a) and 112(1)(b) are respectively configured to delay first control signals corresponding to address signals before inputting into the first 4/16 decoder 111(1) and after inputting into the decoder 111(1); the two 2-delay circuits 112(2)(a) and 112(2)(b) are respectively configured to delay first control signals corresponding to address signals before inputting into the second 4/16 decoder 111(2) and after inputting into the decoder 111(2); and a second control signal corresponding to an address signal inputting into the 3/5 decoder 111(3) may be output directly without being delayed. Moreover, when the delayed first control signal output by the first 4/16 decoder 111(1), the delayed first control signal output by the second 4/16 decoder 111(2) and the non-delayed second control signal output by the 3/5 decoder 111(3) are in a rising edge and/or a high level, a word line corresponding to an address writing 0 for the $1^{st}$ time or for the $i^{th}$ time in the configuration memory 120 may be turned on.

It should be understood that, in the embodiment of the present invention, the delayed first control signal output by the first 4/16 decoder 111(1), the delayed first control signal output by the second 4/16 decoder 111(2) and the non-delayed second control signal output by the 3/5 decoder 111(3) may be all in a rising edge or a high level; or one signal is in a rising edge, and the other two signals are in a high level; or two signals are in a rising edge, and the other signal is in a high level, which is not limited in the embodiment of the present invention.

Specifically, during power-on of the FPGA, it is assumed that content of all addresses of the configuration memory 120 is 1. An address signal is delayed by a 1-delay circuit and then input to an initial control terminal (iniall_cmc) of the first 4/16 decoder 111(1), and is delayed by another 1-delay circuit and then output by an output terminal of the another 1-delay circuit. Output terminals of the another 1-delay circuit may be respectively marked as: pd4to16in1_<0>, pd4to16in1_<1>, . . . pd4to16in1_<15>. Another address signal is delayed by a 2-delay circuit and then input to an initial control terminal (iniall_cmc) of the second 4/16 decoder 111(2), and is delayed by another 2-delay circuit and then output by an output terminal of the another 2-delay circuit. Output terminals of the another 2-delay circuit may be respectively marked as: pd4to16in2_<0>, pd4to16in2_<1>, . . . pd4to16in2_<15>. Another address signal is input to an initial control terminal (iniall_cmc) of the 3/5 decoder 111(3), and is output by an output terminal of the 3/5 decoder 111(3). Output terminals of the 3/5 decoder 111(3) may be respectively marked as: pd3to5in_<0>, pd3to5in_<1>, . . . pd3to5in_<4>.

When pd4to16in1_<0>=1 (the delayed first control signal output by the output terminal 0 of the first 4/16 decoder 111(1) is in a high level), pd4to16in2_<0>=1 (the delayed first control signal output by the output terminal 0 of the second 4/16 decoder 111(2) is in a rising edge), pd3to5in_<0>=1 (the second control signal output by the output terminal 0 of the first 3/5 decoder 111(3) is in a high level), 1 code (for example, ss0_wl_0 shown in FIG. 5) occurs, that is, a word line corresponding to an address number 0 in the configuration memory 120 is turned on, and the driver 0 writes content of the word line to 0 (as shown in FIG. 4A), and this process is writing 0 for the $1^{st}$ time. When the 0 writing operation for the $1^{st}$ time is completed, and pd3to5in_<1>=1 (the second control signal output by the output terminal 1 of the first 3/5 decoder 111(3) is in a high level), because pd4to16in1_<0>=1 (the delayed first control signal output by the output terminal 0 of the first 4/16 decoder 111(1) is in a high level), pd4to16in2<0>=1 (the delayed first control signal output by the output terminal 0 of the second 4/16 decoder 111(2) is in a high level) and pd3to5in_<0>=1 (the second control signal output by the output terminal 0 of the first 3/5 decoder 111(3) is in a high level), 1 code (for example, ss2_wl_122 shown in FIG. 5) occurs, that is, a word line corresponding to an address number 256 in the configuration memory 120 is turned on, and the driver 0 writes content of the word line to 0 (as shown in FIG. 4B), and this process is writing 0 for the $2^{nd}$ time.

When the 0 writing operation for the $2^{nd}$ time is completed, and pd4to16in1_<1>=1 (the first control signal output by the output terminal 1 of the first 4/16 decoder 111(1) is in a rising edge), because pd4to16in1_<0>=1 (the delayed first control signal output by the output terminal 0 of the first 4/16 decoder 111(1) is in a high level), pd4to16in2_<0>=1 (the delayed first control signal output by the output terminal 0 of the second 4/16 decoder 111(2) is in a high level), pd3to5in_<0>=1 (the second control signal output by the output terminal 0 of the first 3/5 decoder 111(3) is in a high level) and pd3to5in_<1>=1 (the second control signal output by the output terminal 1 of the first 3/5 decoder 111(3) is in a high level), 2 codes (for example, ss0_wl_1 and ss2_wl_123 shown in FIG. 5) occur, that is, two word lines corresponding to address numbers 1 and 257 in the configuration memory 120 are turned on, and the driver 0 writes a logic 0 to each memory cell of a row of memory cells corresponding to the word lines that are turned on respectively (as shown in FIG. 4C), and this process is writing 0 for the $3^{rd}$ time.

Figure 5:
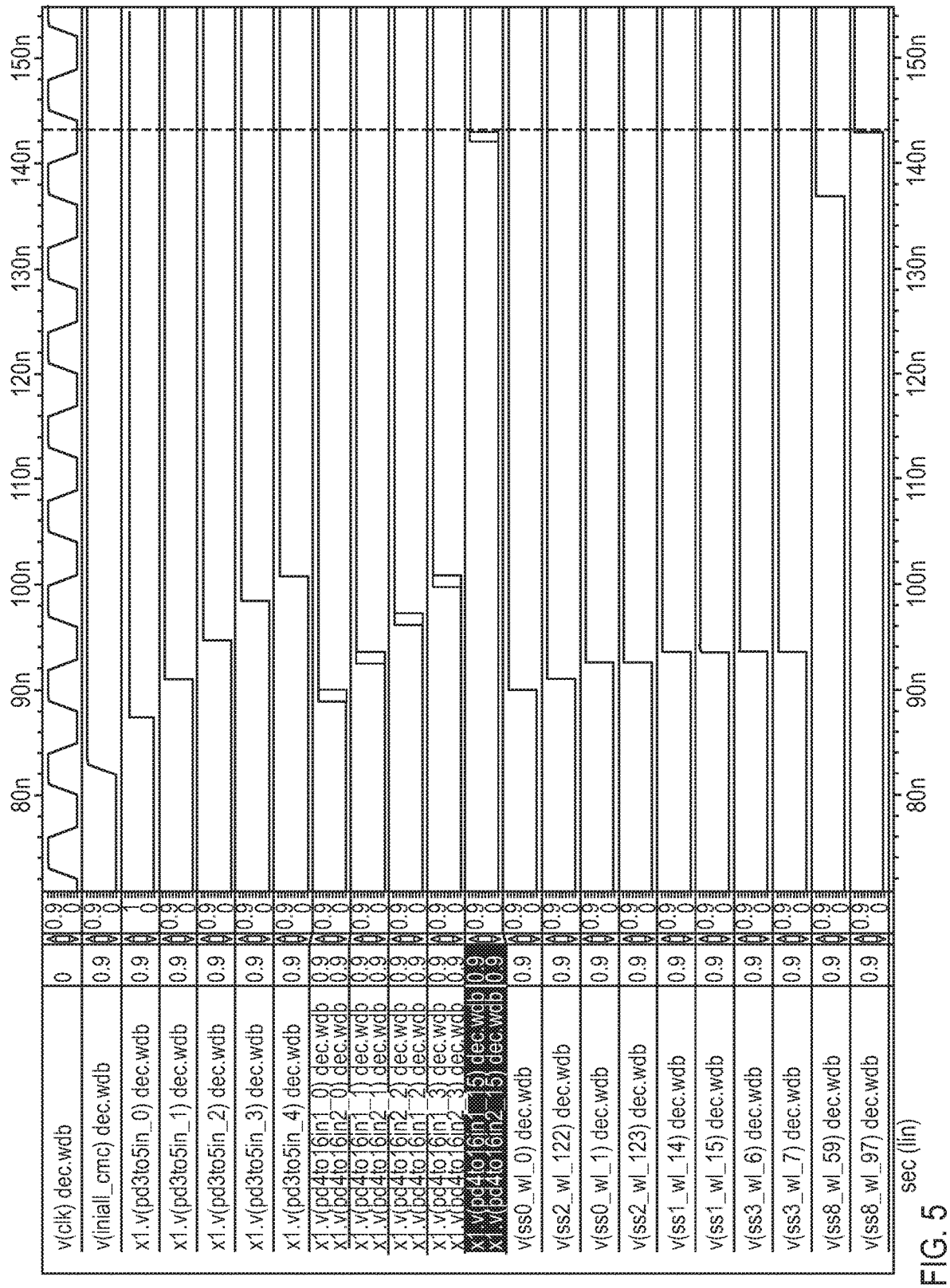
FIG. 5 is an output simulation diagram of a decoding circuit included in the circuit shown in FIG. 3.

When the 0 writing operation for the $3^{rd}$ time is completed, and pd4to16in2_<1>=1 (the first control signal output by the output terminal 1 of the second 4/16 decoder 111(2) is in a rising edge), 4 codes (for example, ss1_wl_14, ss1_wl15, ss3_wl_6 and ss3_wl_7 shown in FIG. 5) occur, that is, four word lines corresponding to address numbers 16, 17, 272 and 273 in the configuration memory 120 are turned on, and the driver 0 writes a logic 0 to each memory cell of a row of memory cells corresponding to the four word lines that are turned on respectively (as shown in FIG. 4D), and this process is writing 0 for the $4^{th}$ time.

By analogy, when pd4to16in2_<15>=1 (the first control signal output by the output terminal 15 of the second 4/16 decoder 111(2) is in a rising edge), 64 codes occur, that is, sixty four word lines related to pd4to16in2_<15> in the configuration memory 120 are turned on, and the driver 0 writes a logic 0 to each memory cell of a row of memory cells corresponding to the last sixty-four word lines that are turned on respectively, thereby completing the power on initialization of the configuration memory 120.

Therefore, in the circuit of power on initialization for a configuration memory of an FPGA provided according to the embodiment of the present invention, the number of turned on addresses is always equal to or less than the sum of addresses having 0 set therein, so that influences of all turned on word lines to bit lines are just balanced, and intervention of a write driver can break such balance, being conducive to writing 0; therefore, the 0 writing operation during the power on initialization of the configuration memory is easier.

It should be noted that, in the embodiment of the present invention, during the power on initialization of the configuration memory 120, it is not performed sequentially according to the sequence of address numbers of all addresses in the configuration memory 120; instead, a corresponding address number during each writing of 0 is determined according to decoders selected according to the address length and the length of delays. For example, during writing 0 for the $1^{st}$ time, a word line corresponding to an address having an address number of 0 is set to 0, during writing 0 for the $2^{nd}$ time, a word line corresponding to an address in other addresses other than the address having the address number of 0 is set to 0, and during writing 0 for the $3^{rd}$ time, word lines corresponding to two addresses in other addresses other than the addresses writing 0 for the $1^{st}$ time and for the $2^{nd}$ time, the address number of the two addresses may be adjacent to each other and may also be separated, which is not limited in the embodiment of the present invention.

The circuit of power on initialization for the configuration memory of the FPGA provided in the embodiment of the present invention uses a delay chain similar to an RC filter shape, and therefore, it can be seen from FIG. 5 that, a time difference occurs between the output of the 3/5 decoder (pd3to5in_0 to pd3to5in_4) and the output of the 4/16 decoders (pd4to16in1_0 to pd4to16in1_15, pd4to16in2_0 to pd4to16in2_15). Meanwhile, because of the existence of the first delay circuit and the second delay circuit, time differences also exist between pd4to16in1_0/pd4to16in2_0, pd4to16in1_1/pd4to16in2_1, . . . pd4to16in1_15/pd4to16in2_15. In this way, when pd4to16in1_<0>=1, pd4to16in2_<0>=1 and pd3to5in_<0>=1, the $1^{st}$ code occurs, that is, ss0_wl_0; when pd3to5in_<1>=1, the $2^{nd}$ code occurs, that is, ss2_wl_122; when pd4to16in1_<1>=1, the $3^{rd}$ and $4^{th}$ codes occur, that is, ss0_wl_1 and ss2_wl_12; when pd4to16in2_<1>=1, the $5^{th}$ to $8^{th}$ codes occur, that is, ss1_wl_14, ss1_wl15, ss3_wl_6 and ss3_wl_, and the rest may be deduced by analogy. The last codes occur when pd4to16in1_<15>=1, and there are totally 16×4=64 codes. In this way, a cycle for completing writing 0 into 1058 addresses of the configuration memory 120 occupy less than 8 clock cycles, and in the prior art, completing writing 0 into 1058 addresses require up to 1058 clock cycles; therefore, the circuit of power on initialization for a configuration memory of an FPGA provided in the embodiment of the present invention can greatly shorten the cycle of initialization.

It should be further noted that, the driving circuit 130 shown in FIG. 2 includes (m+1) drivers, that is: a driver 0 to a driver m, and in the above descriptions, the technical solution of the embodiment of the present invention is described in detail merely by using the embodiment shown in FIG. 3 as an example. The driving circuit in FIG. 3 merely includes a driver 0, and the driver 0 merely correspond to one column in the configuration memory 120; therefore, a working principle of each driver in the driver 1 to driver m in FIG. 2 is completely the same as the working principle of the driver 0, and each driver is responsible for driving writing of 1 column. The configuration memory 120 shown in FIG. 2 includes (m+1) columns, so that the driver 0 to the driver m need to work at the same time to implement the whole power on initialization process of the configuration memory. For ease of description, in the above descriptions, the driver 0, instead of the driver 0 to the driver m, is used to describe the whole power on initialization process of the configuration memory.

In addition, in the embodiment of the present invention, it may also be feasible that when the delayed first control signal output by the first $4/16$ decoder 111(1), the delayed first control signal output by the second $4/16$ decoder 111(2) and the non-delayed second control signal output by the $3/5$ decoder 111(3) are in a falling edge and/or a low level, a word line corresponding to an address writing 0 for the $1^{st}$ time or for the $i^{th}$ time in the configuration memory 120 is turned on. In this case, the process of initialization of the configuration memory 120 is similar to the process of turning on a word line corresponding to an address writing 0 for the $1^{st}$ time or for the $i^{th}$ time in the configuration memory 120 when the delayed first control signal output by the first $4/16$ decoder 111(1), the delayed first control signal output by the second $4/16$ decoder 111(2) and the non-delayed second control signal output by the $3/5$ decoder 111(3) are in a rising edge and/or a high level, and for simplicity, it is not repeated herein.

The circuit of power on initialization for a configuration memory of an FPGA according to the embodiment of the present invention is described in detail with reference to FIG. 1 to FIG. 5, and a method of power on initialization for a configuration memory of an FPGA according to an embodiment of the present invention will be described in detail with reference to FIG. 6 in the following.

FIG. 6 is a schematic flow chart of a method 500 of power on initialization for a configuration memory in an FPGA according to an embodiment of the present invention. The method 500 shown in FIG. 6 may be implemented by using the circuit 100 in the above descriptions, and the method 500 includes:

510: When 0 is set for the $1^{st}$ time, turn on a word line corresponding to an address in the configuration memory, and set content of the word line to 0; and 520: When 0 is set for the $i^{th}$ time, turn on at least one word line corresponding to at least one address in the configuration memory, and write a logic 0 to each memory cell of a row of memory cells corresponding to each word line that is turned on, the number of the at least one address being less than or equal to a sum of addresses that have completed writing of 0 for the previous (i−1) times, where i is a positive integer greater than or equal to 2.

Specifically, in the embodiment of the present invention, the process of power on initialization for the configuration memory of the FPGA is a process of writing 0 into all addresses in the configuration memory, when 0 is set for the $1^{st}$ time, a word line corresponding to an address in the configuration memory may be turned on, and sets a logic 0 to each memory cell of a row of memory cells corresponding to the word line that is turned on; when 0 is set for the $2^{nd}$ time, a word line corresponding to another address in the configuration memory may be turned on, and sets a logic 0 to each memory cell of a row of memory cells corresponding to the word line that is turned on; when 0 is set for the $3^{rd}$ time, two word lines corresponding to other two addresses in the configuration memory may be turned on, and sets a logic 0 to each memory cell of a row of memory cells corresponding to the word line that is turned on; and when 0 is set, the number of addresses that can be turned on by the decoding circuit 110 is less than or equal to the sum of the number of addresses having completed writing of 0 previously, and by such analogy, all addresses in the configuration memory may be set to 0, thereby completing the power on initialization of the configuration memory.

In the method of power on initialization for a configuration memory in an FPGA provided according to the embodiment of the present invention, when 0 is set for the $i^{th}$ time, the number of turned on addresses is less than or equal to the sum of addresses having completed writing of 0 for the previous (i−1) times, i may be a positive integer greater than or equal to 2, and in this way, the problem of a difficult 0 writing operation caused by insufficient driving may be avoided.

Therefore, in the method of power on initialization for a configuration memory in an FPGA provided in the embodiment of the present invention, an address of the configuration memory is turned on and sets a logic 0 to each memory cell of a row of memory cells corresponding to the word line that is turned on, and the number of turned on addresses is less than or equal to the number of addresses having 0 set therein, so that the 0 writing operation during the power on initialization of the configuration memory is easier, and the cycle of initialization can be greatly shortened.

It should be understood that, in the embodiment of the present invention, a time interval of turning on word lines corresponding to addresses writing 0 for the adjacent times is a time of executing and completing the previous 0 writing operation. In other words, a time interval between turning on a word line corresponding to an address writing 0 for the next time and turning on a word line corresponding to an address writing 0 for the previous time is a time of executing and completing the previous 0 writing operation. For example, a time interval between turning on a word line corresponding to an address writing 0 for the $3^{rd}$ time and turning on a word line corresponding to an address writing 0 for the $2^{nd}$ time is a time of executing and completing the 0 writing operation for the $2^{nd}$ time.

Optionally, as an embodiment of the present invention, a first control signal corresponding to a first address signal may be delayed, and a delayed first control signal is output; and then, a word line corresponding to an address writing 0 for the $j^{th}$ time in the configuration memory is turned on according to the delayed first control signal and a non-delayed second control signal corresponding to a second address signal, where j is 1 or i.

Specifically, in the embodiment of the present invention, to ensure that during writing 0 for the $1^{st}$ time and the $i^{th}$ time, the number of turned on addresses is less than or equal to the sum of addresses having 0 set therein, it is required to delay the first control signal corresponding to the first address signal of a part of decoders in the plurality of decoders, and output the delayed first control signal, so that rising edges or falling edges of the delayed first control signal and the non-delayed second control signal do not occur at the same time, but are staggered by a small time length. The plurality of decoders may turn on a word line corresponding to an address writing 0 for the $j^{th}$ time in the configuration memory according to the delayed first control signal and the non-delayed second control signal, where j is 1 or i.

It should be understood that in the embodiment of the present invention, the first control signal may be delayed by using an inverter chain circuit similar to an RC filter circuit. In order that rising edges or falling edges of the delay first control signal and the non-delayed second control signal do not occur at the same time, but are staggered by a small time length, first control signals corresponding to first address signals before inputting to each decoder in a part of decoders and after inputting to each decoder may be respectively delayed. When the delayed first control signal and the non-delayed second control signal are in a first rising/falling edge and/or a first level, a word line corresponding to the address writing 0 for the $j^{th}$ time in the configuration memory is turned on. The first rising/falling edge includes a rising edge or a falling edge, and the first level includes a high level or a low level.

For example, the configuration memory 120 has 1058 addresses with address numbers from 0 to 1057, so that two 4/16 decoders and a 3/5 decoder may be selected to implement the process of power on initialization for the configuration memory. A first address signal is delayed by a 1-delay circuit and then input to an iniall_cmc control terminal of the first 4/16 decoder, and is delayed by another 1-delay circuit and then output by an output terminal of the first 4/16 decoder. The first address signal is delayed by a 2-delay circuit and then input to an iniall_cmc control terminal of the second 4/16 decoder, and is delayed by another 2-delay circuit and then output by an output terminal of the first 4/16 decoder. A second address signal is input to an iniall_cmc control terminal of the 3/5 decoder, and is output by an output terminal of the 3/5 decoder. When the delayed first control signal output by the first 4/16 decoder, the delayed first control signal output by the second 4/16 decoder and the non-delayed second control signal output by the 3/5 decoder are in a rising edge and/or a high level, a word line corresponding to an address writing 0 for the $1^{st}$ time or for the $i^{th}$ time in the configuration memory may be turned on.

It should be understood that, in the embodiment of the present invention, the delayed first control signal output by the first 4/16 decoder, the delayed first control signal output by the second 4/16 decoder and the non-delayed second control signal output by the 3/5 decoder may be all in a rising edge or a high level; or one signal is in a rising edge, and the other two signals are in a high level; or two signals are in a rising edge, and the other signal is in a high level, which is not limited in the embodiment of the present invention.

It should be noted that, in the embodiment of the present invention, it may also be feasible that when the delayed first control signal output by the first 4/16 decoder, the delayed first control signal output by the second 4/16 decoder and the non-delayed second control signal output by the 3/5 decoder are in a falling edge and/or a low level, a word line corresponding to an address writing 0 for the $1^{st}$ time or for the $i^{th}$ time in the configuration memory 120 is turned on.

It should be understood that, in the embodiment of the present invention, the method according to the embodiment of the present invention may be executed correspondingly by the circuit 100 according to the embodiment of the present invention, and corresponding processes of each method in FIG. 1 to FIG. 5 are respectively implemented by the above and other operations and/or functions of each circuit in the circuit 100, which are not repeated herein for simplicity.

In addition, terms "and/or" in this text is merely an association relation describing associated objects, and may indicate three relations, for example, A and/or B may indicate three cases: A exists alone, A and B exist at the same time, and B exists alone. Moreover, the character "/" in this text generally indicates that the associated objects before and after it are in an "or" relation.

It should be understood that in the embodiments of the present application, serial numbers of processes do not indicate priorities of execution sequences, the execution sequences of the processes should be determined according to functions and inner logic thereof, and should not constitute any limitation to implementation processes of the embodiments of the present application.

A person of ordinary skill in the art may aware that, units and algorithm steps of examples described according to the embodiments disclosed in the present invention can be implemented by means of electronic hardware, computer software or a combination of the two. In order to illustrate the exchangeability of hardware and software, components and steps of examples are generally described according to functions in the above descriptions. Whether the functions are executed by hardware or software depends on specific applications and design constraint conditions of the technical solutions. Persons skilled in the art can use different methods to implement the described functions for every specific application, but it should not be considered that this implementation goes beyond the scope of the present invention.

The foregoing embodiments only describe specific implementation manners of the present invention, but cannot be understood as a limitation to the patent scope of the present invention. Any equivalent variation or replacement that can be easily made by a person skilled in the art without departing from the technical scope disclosed in the present invention shall fall within the protection scope of the present invention. Therefore, the patent protection scope of the present invention should be subject to the appended claims.

What is claimed is:

1. A circuit for power on initialization of a configuration memory of a Field-Programmable Gate Array (FPGA), the circuit comprising: a decoding circuit, a driving circuit and the configuration memory, wherein the decoding circuit is configured to turn on a word line corresponding to an address in the configuration memory, and the driving circuit writes a logic 0 to each memory cell of a row of memory cells corresponding to the word line that is turned on; and for an ith time, the decoding circuit is configured to turn on at least two other word lines corresponding to at least two other addresses in the configuration memory, and the driving circuit writes a logic 0 to each memory cell in each row of memory cells corresponding to the at least two other word lines that are turned on, the number of the at least two other addresses being less than or equal to the number of addresses that have completed writing of 0 for the previous (i−1) times, wherein i is a positive integer greater than 2, and wherein the decoding circuit includes a plurality of decoders and a delay circuit, wherein the delay circuit is configured to delay a first control signal corresponding to an address signal of a portion of the plurality of decoders, and output a delayed first control signal; and the plurality of decoders is configured to turn on the word line or the at least two other word lines according to the delayed first control signal and a non-delayed second control signal.

2. The circuit according to claim 1, wherein the plurality of decoders comprises a first decoder, a second decoder and a third decoder, and the delay circuit comprises two first delay circuits and two second delay circuits, wherein
the two first delay circuits are respectively configured to delay first control signals corresponding to address signals before inputting into the first decoder and after inputting into the first decoder, and output delayed first control signals;
the two second delay circuits are respectively configured to delay first control signals corresponding to address signals before inputting into the second decoder and after inputting into the second decoder, and output delayed first control signals; and
when the delayed first control signals output by the first decoder and the second decoder and the non-delayed second control signal output by the third decoder are in a first rising/falling edge or a first level, the plurality of decoders turns on the word line corresponding to the address writing 0 for a jth time in the configuration memory.

3. The circuit according to claim 1, wherein the delay circuit is an inverter chain circuit.

4. The circuit according to claim 1, wherein, a time interval of the decoding circuit turning on word lines corresponding to addresses writing 0 includes the completion of a previously started 0 writing operation.

5. A method for power on initialization of a configuration memory of a Field-Programmable Gate Array (FPGA), comprising:
turning on a word line corresponding to an address in the configuration memory, and writing a logic 0 to each memory cell of a row of memory cells corresponding to the word line that is turned on; and
for an $i^{th}$ additional time, turning on at least two other word lines corresponding to at least two other addresses in the configuration memory, and writing a logic 0 to each memory cell of each row of memory cells corresponding to the at least two other word lines that is turned on, the number of the at least two other addresses being less than or equal to the number of addresses that have completed writing of 0 for the previous (i−1) times, wherein i is a positive integer greater than 2, and wherein the method further comprises: delaying a first control signal corresponding to a first address signal, and outputting a delayed first control signal; and turning on the word line or the at least two other word lines according to the delayed first control signal and a non-delayed second control signal.

6. The method according to claim 5, wherein the turning on a word line corresponding to the address writing 0 for a $j^{th}$ time in the configuration memory according to the delayed first control signal and the non-delayed second control signal comprises:
when the delayed first control signal and the non-delayed second control signal are in a first rising/falling edge and/or a first level, turning on a word line corresponding to the address writing 0 for the $j^{th}$ time in the configuration memory.

7. The method according to claim 5, wherein the first control signal corresponding to the first address signal is delayed with an inverter chain circuit, and the delayed first control signal is output.

8. The method according to claim 5, wherein, a time interval of turning on word lines corresponding to addresses writing 0 includes the completion of a previously started 0 writing operation.

* * * * *